United States Patent [19]
Aufderheide

[11] Patent Number: 4,562,315
[45] Date of Patent: Dec. 31, 1985

[54] CAPACITANCE MEMBRANE SWITCH

[75] Inventor: Brian E. Aufderheide, Cedarburg, Wis.

[73] Assignee: W. H. Brady Co., Milwaukee, Wis.

[21] Appl. No.: 652,802

[22] Filed: Sep. 20, 1984

[51] Int. Cl.<sup>4</sup> ............................................. H03K 17/96
[52] U.S. Cl. ................... 200/5 A; 200/52 R;
200/DIG. 1; 340/365 C; 361/288
[58] Field of Search .................. 200/5 A, 52, DIG. 1,
200/159 R, 264, 307; 361/288, 283, 290;
340/365 C; 400/479.1

[56] References Cited
U.S. PATENT DOCUMENTS

| | | | |
|---|---|---|---|
| 3,974,332 | 8/1976 | Abe et al. | 340/365 C X |
| 4,295,699 | 10/1981 | DuRocher | 200/264 X |
| 4,367,385 | 1/1983 | Frame | 340/365 C |
| 4,379,287 | 4/1983 | Tyler et al. | 340/365 C |
| 4,400,758 | 8/1983 | Frame | 340/365 C X |

Primary Examiner—J. R. Scott
Attorney, Agent, or Firm—Quarles & Brady

[57] ABSTRACT

A capacitance membrane switch (1) including first (64,68), second (52,58) and third capacitor plates (44-48) wherein the third capacitor plates consist of conductive adhesive.

4 Claims, 5 Drawing Figures

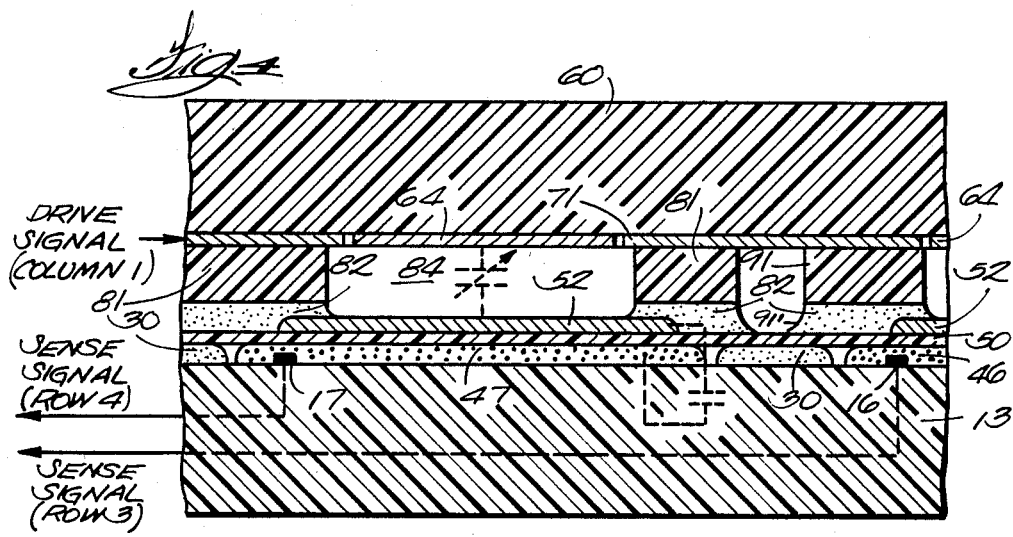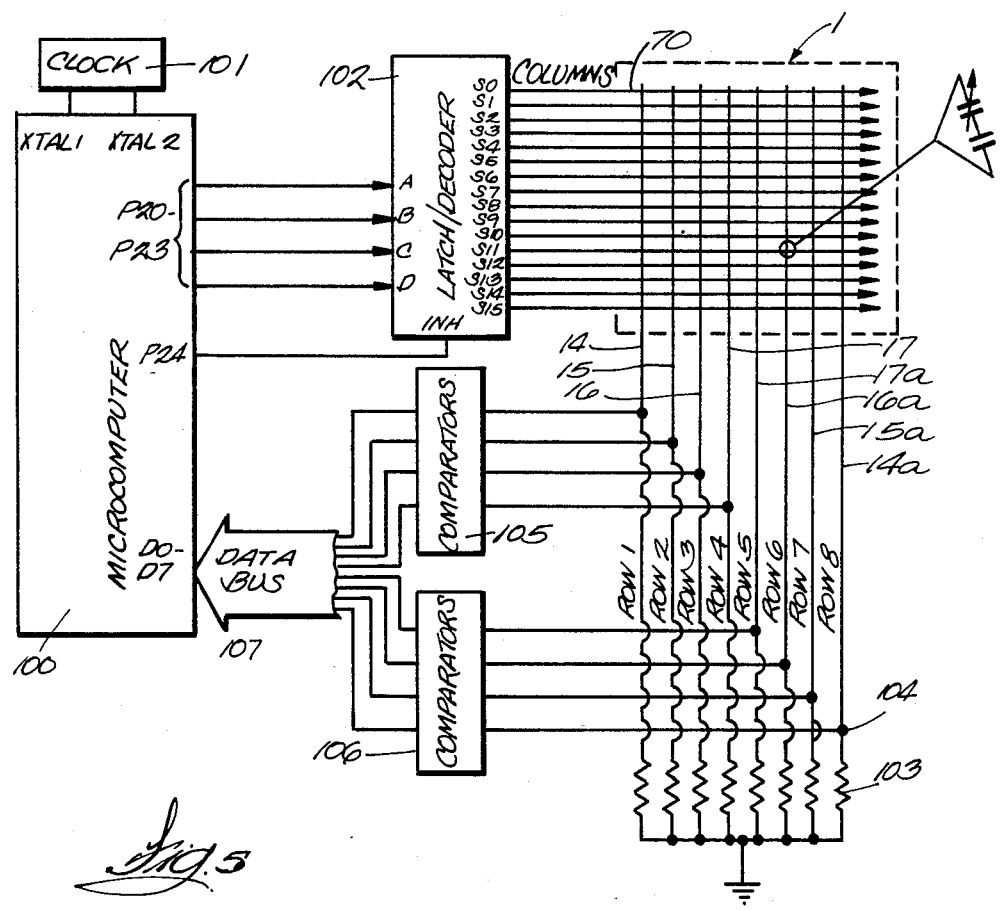

CAPACITANCE MEMBRANE SWITCH

TECHNICAL FIELD

This invention relates to electrical switches of the type having movable contacts disposed on a flexible plastic film, for example membrane switches; more particularly, this invention relates to capacitance membrane switches which develop a detectable signal by reason of the change in capacitance between a pair of conductive plates or electrodes.

BACKGROUND ART

The term membrane switches is generally used to refer to electrical switches constructed of two or more spaced layers of plastic film carrying conductive zones, areas or electrodes that are typically printed on the films with conductive inks. One film is arranged to be flexed or depressed toward another so as to establish an electrical circuit between specific electrodes, thereby generating a signal that can be detected by external circuitry to which the membrane switch is connected. The term membrane switches is also used in reference to switches having a single flexible plastic film of the foregoing type in combination with a rigid substrate or layer, each carrying conductive zones, areas or electrodes.

Membrane switches have become significant articles of commerce within approximately the last decade, and presently find widespread use in installations in which a sealed or protected switch or operating panel is a desirable component. Thus, membrane switches find use in equipment which requires manual data entry such as computer keyboards, terminals, cash registers and the like. Also, membrane switches are widely used as a control or instrument panel for appliances such as washers and microwave ovens, industrial controls, copy machines, and the like, in which a finger touch micromotion actuation is a useful feature.

Membrane switches are actuated simply by an operator depressing, with a finger, a selected or designated area of one layer of the switch towards another layer, the two layers being closely spaced from one another so that only a slight amount of movement of the layer which is depressed is required for proper operation.

Membrane switches have been primarily of the resistance type in which two contacts are closed and electric current flows through them in proportion to the voltage applied across them. Resistance switches are well known in the art and particular constructions for this type of membrane switch are disclosed in a number of patents assigned to the assignee of this application, including e.g., U.S. Pat. Nos. 4,217,473, 4,218,600 and 4,264,797.

A more recent development in the art of membrane switches is the capacitance type of membrane switch which operates upon the change of capacitance between spaced electrodes or contacts. In a capacitance membrane switch, a first set of capacitor plates or contacts is formed as a conductive pattern on the underside of a first film layer. A dielectric film layer is spaced from the first film layer and second and third capacitor plates are located on either side of the dielectric film layer. Assuming the second capacitor plates face the first capacitor plates on the underside of the first film layer, a variable air capacitor is established between the first and second capacitor plates and a fixed capacitor is established between the second and third capacitor plates, with the variable and fixed capacitors being in series with one another. When the conductive pattern on the underside of the first film layer and the third capacitor plates are connected to external circuitry, a detectable change in capacitance is developed when the first layer is depressed to establish contact between the conductive pattern on its underside and the second capacitor plates. Capacitance membrane switches of this general type are described in U.S. Pat. No. 4,367,385 assigned to the assignee of this application and U.S. Pat. No. 4,359,720 assigned to Honeywell Inc.

The research and development work that culminated in the present invention has for its objective the provision of a novel structure for capacitance membrane switches that would result in an improved switch construction and facilitate the manufacture of capacitance membrane switches. These and other advantages are explained in greater detail following the structural and electrical description of the present invention.

DISCLOSURE OF INVENTION

In accordance with my present invention, I provide a capacitance membrane switch of the type including opposed capacitor plates separated by a dielectric film layer wherein one of the capacitor plates consists of a layer or zone of conductive adhesive. The zone or zones of conductive adhesive are tri-functional in the switch construction in that they (1) form one of the capacitor plates of the switch, (2) mechanically bond portions of the dielectric film layer to another layer spaced therefrom, and (3) provide a conductive interface with a conductive pattern carried on a surface of such other layer.

DESCRIPTION OF THE DRAWINGS

The present invention is described below, as required by 35 U.S.C. §112, in such full detail as to enable those skilled in the art to practice the invention and also to set forth the presently-contemplated best modes for its practice, all by reference to the following drawings in which:

FIG. 4 is an enlarged sectional view of a portion of the capacitance membrane switch of FIG. 1 taken along the plane of line 4—4 of FIG. 3; and FIG. 5 is an electrical schematic diagram of the capacitance membrane switch of FIG. 1 and associated decoding circuitry.

BEST MODES FOR CARRYING OUT THE INVENTION

The following description is arranged in three parts to facilitate a full understanding of the present invention: (1) structural description, including specific examples, (2) electrical description, which explains the operation of the capacitance membrane switch of this invention, and (3) industrial applicability, setting forth a number of significant advantages of my new capacitance membrane switches and typical uses for the switches.

(1) Structural Description

Figure 1:
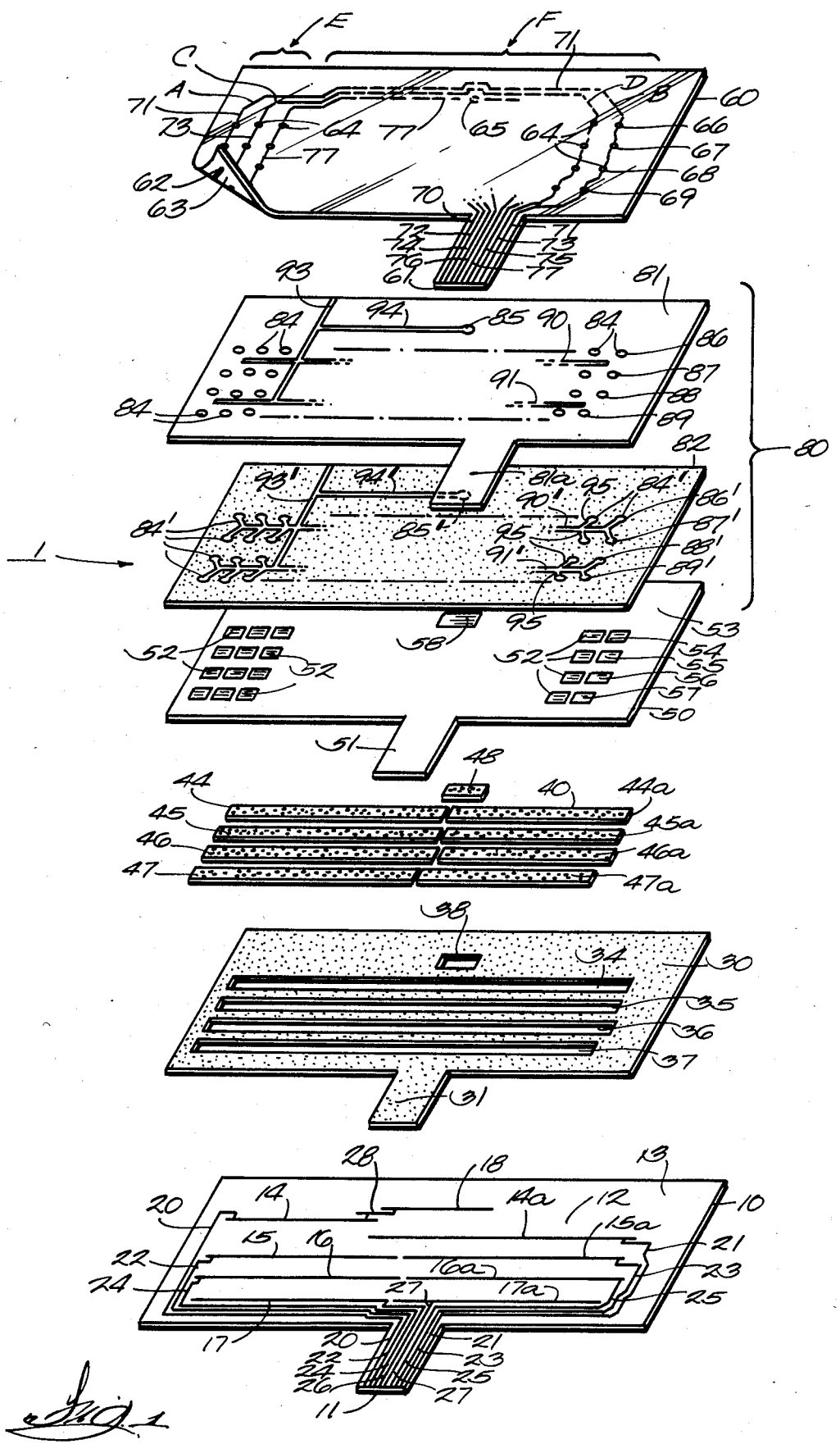
FIG. 1 is an exploded view of a capacitance membrane switch constructed in accordance with this invention.
Figure 2:
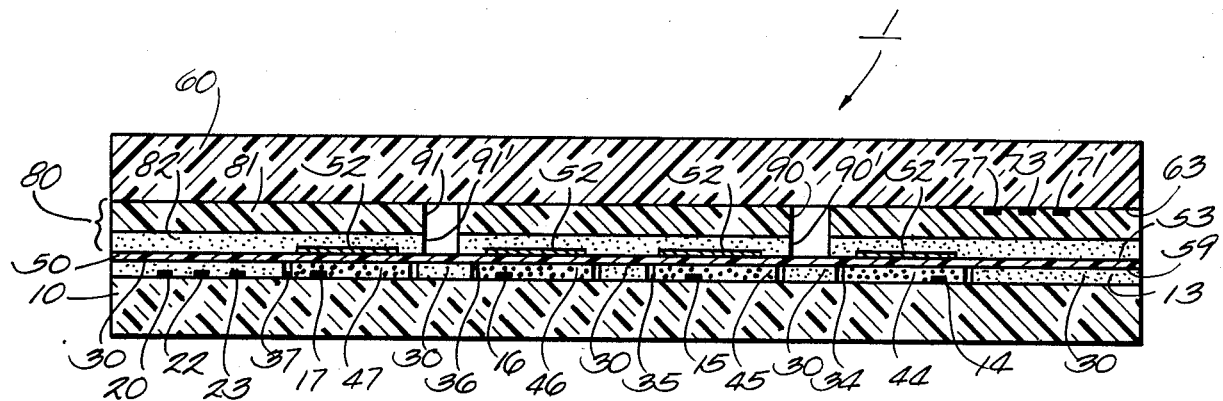
FIG. 2 is a sectional view of the capacitance membrane switch of FIG. 1 taken along the plane of line 2—2 of FIG. 1.
Figure 3:
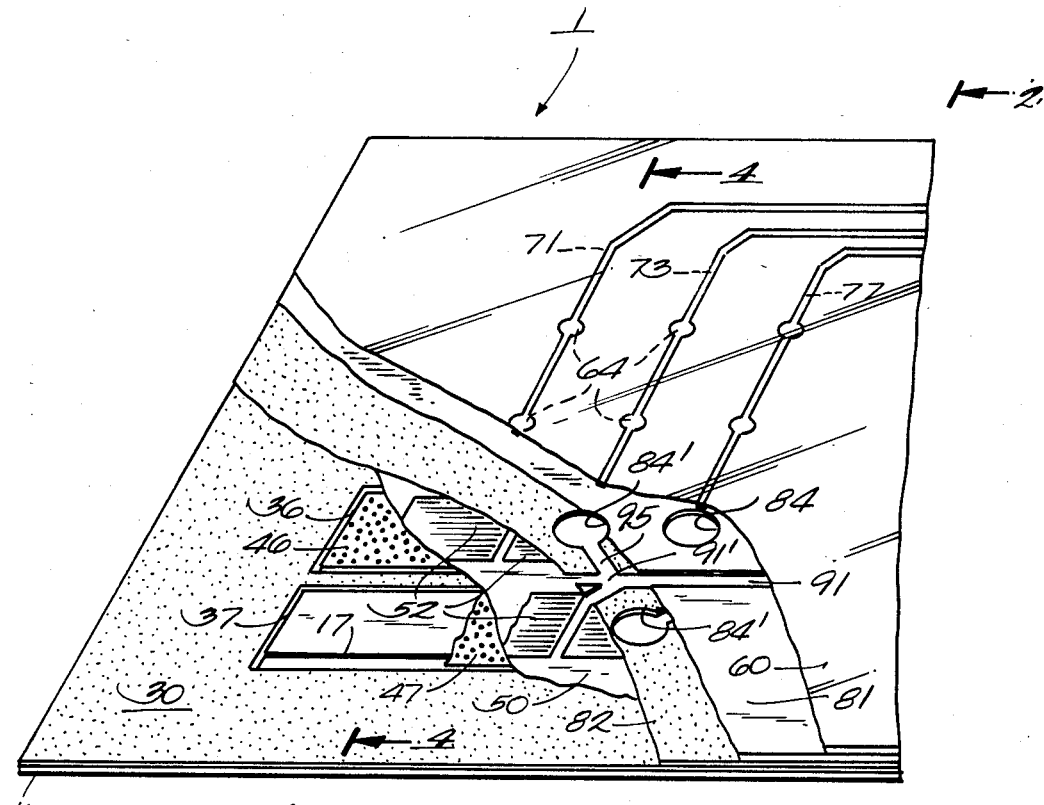
FIG. 3 is a perspective view of the capacitance membrane switch of FIG. 1, with portions broken away to further clarify its structural details.

FIG. 1 is an exploded view of an exemplary form of a capacitance membrane switch according to this invention identified by the general reference numeral 1 in which the various layers of the switch are separated from one another for clarity of description, it being understood that the layers are joined together to form the assembled switch as shown in FIGS. 2 and 3. Each layer of the switch 1 is explained in subsections (a)–(f) below by reference to FIG. 1, starting with the lowermost layer shown in the drawing.

(a) First layer 10 of the switch 1 is illustrated as a layer of suitable flexible plastic film, and is shown as a general rectangular element, although it can be any specific shape for a particular application. A tail 11 extends from one side of the layer 10, for the purpose described below. A conductive pattern 12 is carried on the upper surface 13 of the layer 10 and comprises a plurality of spaced parallel longitudinal conductive tracks 14–18 and a plurality of conductors 20–28. Conductive tracks 14 and 14a are parallel to and spaced from one another, and each extends partially across the longitudinal direction of the layer 10. Conductive tracks 15 and 15a are arranged in an end-to-end relationship with each other and slightly spaced from one another; the pairs of conductive tracks 16 and 16a and 17 and 17a are arranged in a similar fashion. Conductive track 18 is a shorter longitudinally-aligned conductive track spaced outwardly of track 14. Conductor 20 extends from near an end of conductive track 14 first transversely across the layer 10, next longitudinally along the layer 10, and thereafter transversely along the tail 11. In a similar fashion, conductors 21, 22, 23, 24 and 25 extend from near an end of conductive tracks 14a, 15, 15a, 16 and 16a respectively and along the tail 11. Conductor 26 extends from near an end of conductive track 17 first longitudinally along the layer 10 and then transversely along the tail 11, and conductor 27 extends transversely of the layer 10 and along the tail 11 from near an end of conductive track 17a. Conductor 28 connects conductive track 18 to conductive track 14 as illustrated.

The particular form of the conductive pattern 12 on the surface of the layer 10 is not a part of the present invention, and the conductive pattern can be of any style suitable for a particular switch design or application and may for example, comprise a plurality of conductive areas or pads connected to conductors extending onto the tail of the layer.

As to materials, the layer 10 can be made of any nonconductive flexible plastic film suitable for membrane switches: polyester films, such as polyethylene terephthalate films, are the most commonly used materials, although, polycarbonate films, polyimide films and polysulfone films, as well as others such as polyolefin and unplasticized polyvinyl chloride films, may be used. The film can be in the range of about 1 to 15 mils thick, or thicker if so desired, with 5 mil thick films being preferred as providing physical properties appropriate to most membrane switch applications at a reasonable cost. Also, however, the layer 10 can be a rigid element, such as a layer of circuit board material, plastic or other non-conductive material.

The conductive pattern 12 can be printed onto the surface 13 of the layer 10, such as by screen printing suitable conductive inks containing silver, gold, copper, carbon or graphite or other appropriate metal powders dispersed in a suitable binder to form the selected pattern. Many suitable conductive inks are known in the art and are commercially available. Also, however, the conductive pattern can be formed by vacuum deposition of conductive metals such as silver, gold, aluminum or copper onto the surface of the layer 10, as well as by etching techniques or by plating techniques.

(b) Nonconductive adhesive layer 30 is the next element of the switch 1 and is formed in the same size and shape as the layer 10, including a tail 31 at the same location as tail 11. Tail 31 is about ¼" shorter than tail 11 of the layer 10 so as to leave an exposed end portion of tail 11 for attachment to a connector. Adhesive layer 30 is shown as a patterned layer including four parallel, spaced elongated apertures 34, 35, 36, and 37 extending longitudinally across most of the length of the layer and a shorter aperture 38 positioned outwardly of apertures 34 and parallel thereto as shown. In the assembled switch as illustrated in FIGS. 2 and 3, the adhesive layer 30 is adhered to and covers the surface 13 of layer 10 except for the portions of the surface 13 within the apertures 34–38 and at the end of the tail 11.

The adhesive layer 30 is to function as an assembly adhesive joining the layer 50 to be described in part (d) below to the layer 10, and may comprise a layer of heat activated adhesive, thermoset adhesive, or pressure sensitive adhesive. Many suitable adhesives are well known in the art, and a particular adhesive should be selected with regard to the specific materials employed for the layers 10 and 50. The adhesive layer 30 may be of any selected thickness, with a thickness in the range of about 0.1 to 5 mils being suitable for most membrane switch constructions, although the layer can be thicker if so desired.

(c) The next element of the switch 1 is a conductive adhesive layer 40 which, in the exemplary embodiment, comprises a plurality of spaced blocks or zones of adhesive 44 and 44a, 45 and 45a, 46 and 46a, 47 and 47a and 48 arranged as shown in FIG. 1. In the assembled switch, illustrated in FIGS. 2 and 3, the blocks or zones 44 and 44a of the conductive adhesive layer are positioned in the aperture 34 of adhesive layer 30; blocks 45 and 45a of the conductive adhesive layer are positioned within the aperture 35 of adhesive layer 30; blocks 46 and 46a of the conductive adhesive layer are positioned within the aperture 36 of the adhesive layer 30; and blocks 47 and 47a of the conductive layer are positioned within the aperture 37 of the adhesive layer 30. Similarly, block 48 of the conductive adhesive layer is positioned within the aperture 38 of the adhesive layer 30. This arrangement is depicted in FIG. 3 wherein block 47 of the conductive adhesive layer 40 is positioned within aperture 37 of the adhesive layer 30, and block 46 is positioned within aperture 36 of the adhesive layer 30.

The conductive adhesive layer 40 is an essential element of the present invention, and its functionality in the switch construction and suitable compositions are described below in greater detail in part (h) hereof. The conductive adhesive layer 40 is to be of about the same thickness as the adhesive layer 30, or preferably somewhat thicker for the reason described in part (h).

(d) The next element of the switch 1 is a dielectric film layer 50 of the same shape and size of the layer 10. Dielectric film layer 50 includes a tail 51 of the same size and shape as tail 31 of layer 30 and will be superimposed thereon in the assembled switch. A plurality of capacitor plates 52 are carried on the upper surface 53 of the layer 50. The capacitor plates 52 are arranged in a first row 54, a second row 55, a third row 56 and a fourth row 57 thereof. The rows 54–57 extend longitudinally along the dielectric film layer 50 and are parallel to but spaced from one another. The capacitor plates 52 are arranged in generally column form among the rows 54–57. A separate capacitor plate 58 is spaced from the first row 54 of the capacitor plates 52 on the upper surface 53.

The dielectric film layer 50 is to comprise a layer of flexible plastic film, such as polyester film, (generally polyethylene terephthalate film), polycarbonate film, polyvinyl fluoride film, polyvinylidene fluoride film, or polyolefin film. Suitable materials are available commercially from a number of companies, including Dupont and General Electric. Since the layer 50 is to form the dielectric layer of a capacitance element, as explained in detail in part (2) below, it is preferable that the layer be quite thin so as to provide for high capacitance; for this reason, capacitor grade plastic films of about 0.1 mil to 5 mils thick are generally most useful, with a film about 0.25 to 0.50 mils thick preferred for most switch applications.

The capacitor plates 52 and 58 can be applied to the surface 53 of the dielectric layer by any appropriate technique. A useful technique is to print the plates 52 and 58 onto the dielectric layer by screen printing techniques utilizing conductive inks such as those including silver, graphite, carbon, copper or gold metal powders in a suitable binder. The plates 52 and 58 may also be applied by vacuum deposition of metals such as silver, gold, aluminum or copper onto the surface of the film or by plating techniques. As was the case with the conductive pattern 12 on the first layer 10, the array of capacitor plates 52 and 58 can be applied in patterns other than that illustrated in FIG. 1.

(e) The uppermost element of the switch 1 as illustrated in FIG. 1 is a flexible film layer 60 of plastic film, which is of the same size as lower layer 10. A tail 61 extends from one side of the layer 60 that is offset longitudinally relative to the tail 11 of the lower layer 10. An upper conductive pattern 62 is carried on the bottom surface 63 of the layer 60. The pattern 62 includes a plurality of capacitor plates 64 arranged in column-portions of four each in a first row 66 extending longitudinally across the layer 60, a second longitudinal row 67, third longitudinal row 68 and fourth longitudinal row 69 thereof. A capacitor plate 65 is positioned outwardly of the first row 66 of the capacitor plates 64. The capacitor plates 64 are connected by conductors 70, 71, 72, 73, 74, 75, 76 and 77. Each conductor 70–77 interconnects two column-portions of plates 64 to form a column of eight capacitor plates 64 electrically connected together and has a portion extending along the tail 61 as shown in FIG. 1. Thus, conductor 71 interconnects the left hand column-portion A of capacitor plates 64 and the right hand column-portion B of plates 64 as shown in FIG. 1, and conductor 73 interconnects the next innermost column-portions C and D of plates 64. The other capacitor plates 64 and capacitor plate 65 of the pattern 62 are connected to other of the conductors 70, 72 and 74–77.

The conductive pattern 62 illustrated in FIG. 1 would typically be used with a computer input keyboard that includes capacitor plates 64 in a left hand array E and capacitor plates 64 in a right hand array F. Array F includes capacitor plates 64 for the actuating keys of a typical qwerty typewriter keyboard, and array E includes plates 64 for calculator keys as part of the keyboard; capacitor plate 65 would be for a space key of the keyboard. Any selected pattern for the upper conductive pattern 62 can be used for the switch 1, depending on the intended use for the switch, however, and the specific pattern 62 illustrated in the drawings is not part of the present invention.

The flexible film layer 60 can be made of any nonconductive flexible plastic film suitable for membrane switches. Polyester films, particularly polyethylene terephathlate films, are most commonly used, although polycarbonate films, polyimide films and polysulfone films, as well as others such as polyolefin and unplasticized polyvinyl chloride films, may be used. The film 60 can be in the range of about 2 to 20 mils thick and should be thick enough so that it will maintain its spacing from the first layer 10; the specific film chosen for a particular application will depend in part upon the amount of force for actuating the switch selected by the designer. A film 60 of about 5 mils thick is suitable for most membrane switch applications. The upper conductive pattern 62 is to adhere to the bottom surface 63 of the film 60 and it may be applied thereto by the same techniques and materials described above in part (a) in connection with the conductive pattern 12, for example, screen printing with conductive inks, vacuum deposition, etching or plating techniques.

(f) A spacer layer 80 is interposed between the flexible film layer 60 and the dielectric film layer 50. In the embodiment of FIG. 1, the spacer layer 80 includes an upper stratum 81 and a lower stratum 82. The upper stratum 81 comprises a coating of ultraviolet light curable material which is coated onto and adhered to the bottom surface 63 of the flexible layer 60; it is shown in FIG. 1 as being separate from the layer 60 for clarity of description. The upper stratum 81 includes a tail portion 81a which is of the same location and shape as the tail 61 of the layer 60 but is about ¼" shorter to leave an exposed end portion of tail 61 for attachment to a connector. The lower stratum 82 is a layer of pressure sensitive adhesive.

The stratum 81 of the spacer layer 80 includes a plurality of apertures 84 that extend through the entire thickness of the stratum and are slightly larger in size than the capacitor plates 64 of the upper conductive pattern 62 of the layer 60 and an aperture 85 that is slightly larger than capacitor plate 65 thereof. In the assembled switch, one aperture 84 is arranged underneath each plate 64 and aperture 85 is underneath plate 65. The apertures 84 are arranged in four parallel rows 86, 87, 88 and 89. A longitudinal plenum channel 90 extends through the stratum 81 and is located between rows 86 and 87 of the apertures 84. A longitudinal plenum channel 91 also extends through the stratum 81 and is positioned between rows 88 and 89 of the apertures 84. Plenum channels 90 and 91 are each connected to a vent channel 93, also formed as an aperture extending through the entire thickness of the stratum 81. Aperture 85 is connected to plenum channel 94 that extends to vent channel 93.

The stratum 82 of the spacer layer 80 includes a plurality of apertures 84' that are the same size as apertures 84 of the stratum 81. Apertures 84' extend through the entire thickness of the stratum 82. There is one aperture 84' in the stratum 82 for each aperture 84 of the stratum 81, so that in the assembled switch there will be an aperture 84' under each aperture 84. The apertures 84' of the stratum 82 are arranged in four parallel rows 86', 87', 88' and 89'. The apertures 84' of the row 86' and the apertures 84' of the row 87' are connected to a longitudinal manifold channel 90' by connecting channels 95, and the apertures 84' of the rows 88' and 89' are connected to a longitudinal manifold channel 91' by similar connecting channels 95. The manifold channels 90' and 91' are located underneath and in registry with the longitudinal plenum channels 90 and 91 of the stratum 81 in the assembled switch. Manifold channels 90' and 91' are each connected to vent channel 93' which underlies and is in registry with the vent channel 93 of the stratum 81. The stratum 82 also includes a channel 94' that connects an aperture 85' which underlies and is in registry with aperture 85 of the stratum 81, to the vent channel 93'.

The vent channels 93 and 93' extend to an outer edge of the spacer layer 80 and are employed to equalize internal air pressure built up between flexible film layer 60 and dielectric film layer 50 with the external atmospheric pressure so as to permit proper actuation of the switch 1. For example, excess air pressure within the registered apertures 84 and 84' of the assembled switch will be vented through manifold channels 90' or 91', and their associated superimposed plenum channels 90 and 91, through vent channels 93 and 93' and to the atmosphere.

The spacer layer 80 is of a thickness appropriate to maintaining the flexible film layer 60 out of contact with the dielectric film layer 50; for most switch applications, a spacer layer in the range of about 1.5 to 10 mils thick is appropriate. Also, however, the spacer layer should not be so thick as to prevent the capacitor plates 64 from being depressed into contact with the capacitor plates 52 on the upper surface of the dielectric film layer 50 when the switch is to be operated. Many types of coatings can be used for the stratum 81 of the spacer layer such as ultraviolet curable coatings, solvent coatings of thermoplastic resins such as acrylics and polyesters or thermoset resins such as urethanes and epoxies. Any coating that can be applied in the requisite thickness may be used. Also, instead of the coating 81 and adhesive 82 strata, the spacer layer 80 can be made of a layer of plastic film with adhesive on both of its surfaces, or it may be a single thick layer of adhesive. Further, although illustrated as pressure sensitive adhesive, the stratum 82 of the spacer layer may be made of heat activated adhesive or thermoset adhesive. To manufacture the switch 1, the stratum 81 when comprising a coating is first coated onto the bottom surface 63 of the flexible film layer 60, and then the adhesive layer 82 is applied over the coating of stratum 81.

(g) The capacitance membrane switch 1 in its assembled condition is illustrated in sectional view in FIG. 2 and perspective view in FIG. 3, which should be referred to for the following description.

The non-conductive adhesive layer 30 is adhered to the upper surface 13 of the lower layer 10 and the lower surface 59 of the dielectric film layer 50 so as to firmly bond the layers 10 and 50 together. In this condition, conductive track 14 of the conductive pattern 12 on the upper surface of the layer 10 is positioned within and slightly spaced from a side edge of aperture 34 of the adhesive layer 30 and conductive track 14a is positioned within aperture 34 along an opposite side edge thereof. Conductive tracks 15 and 15a are positioned within and near an edge of aperture 35 of the non-conductive adhesive layer 30, conductive tracks 16 and 16a are positioned within and near an edge of aperture 36 of the adhesive layer 30; conductive tracks 17 and 17a are positioned within and near an edge of aperture 37; and conductive track 18 is positioned within and near an edge of aperture 38 of the adhesive layer 30. The remaining portion of the conductive pattern 12 is covered by the non-conductive adhesive layer 30.

The conductive adhesive layer 40 is positioned within the apertures 34–38 of the non-conductive adhesive layer 30 so that its several elements cover conductive tracks 14–18 of the pattern 12. Turning first to FIG. 3, it will be noted that block 47 of the conductive adhesive layer 40 is positioned within aperture 37 of the non-conductive adhesive layer 30 and covers conductive track 17; also, block 46 of the conductive adhesive layer 40 is located within aperture 36 of layer 30 and covers conductive track 16 of the pattern 12. Thus, in the assembled switch, blocks 44 and 44a of the conductive adhesive layer 40 are located within aperture 34 of the non-conductive adhesive layer 30 and cover, respectively, conductive tracks 14 and 14a of the pattern 12; blocks 45 and 45a of the conductive adhesive layer are located within aperture 35 of layer 30 and cover, respectively, conductive tracks 15 and 15a; blocks 46 and 46a of the conductive adhesive layer 40 are located within aperture 36 of layer 30 and cover, respectively, conductive tracks 16 and 16a; blocks 47 and 47a of layer 40 are located within aperture 37 of layer 30 and cover, respectively, tracks 17 and 17a; and block 48 of the layer 40 is located within aperture 38 of layer 30 and covers conductive track 18. This relationship is illustrated in FIG. 2 with respect to blocks 44, 45, 46 and 47 of the conductive adhesive layer 40.

As previously described, the non-conductive adhesive layer 30 serves to bond together the dielectric film layer 50 and the lower layer 10. Also, however, the conductive adhesive layer 40 is joined to both the upper surface 13 of the lower layer 10 and the bottom surface 59 of the dielectric film layer 50 to additionally bond together the layers 50 and 10 in the portions thereof not covered by the adhesive layer 30 by reason of the apertures 34–38 therein.

Further, the conductive adhesive layer 40 is arranged to underlie the capacitor plates 52 (see FIG. 2) and 58 carried on the top surface 53 of the dielectric film layer 50. The first row 54 of capacitor plates 52 are positioned above the blocks 44 and 44a of layer 40 in the assembled switch; the second row 55 of capacitor plates 52 are positioned above blocks 45 and 45a of layer 40; the third row 56 of capacitor plates 52 are positioned above blocks 46 and 46a of layer 40; the fourth row 57 of capacitor plates 52 are positioned above blocks 47 and 47a of layer 40; and upper capacitor plate 58 is positioned above block 48 of layer 40.

The adhesive stratum 82 of the spacer layer 80 is bonded to the top surface 53 of the dielectric film layer 50 and serves to join the flexible film layer 60 thereto in the completed switch 1 inasmuch as the upper strata 81 of the spacer layer 80 is, as previously described, coated onto the bottom surface 63 of the layer 60. The apertures 84 and 84' of the spacer layer 80 are arranged in registration with the capacitor plates 52 of the dielectric film layer 50 and aperture 85 of spacer layer 80 is arranged in registry with capacitor plate 58 of film layer 50. The first row 86 and 86', respectively, of apertures 84 and 84' of the spacer layer are positioned such that there is an aperture 84 and 84' positioned over each capacitor plate 52 of the first row 54 thereof; similarly, an aperture 84 and 84' of the rows 87 and 87', 88 and 88' and 89 and 89' are positioned, respectively, above a plate 52 of the rows 55, 56 and 57 thereof. Apertures 85 and 85' of the spacer layer 80 are positioned above capacitor plate 58.

(h) The conductive adhesive layer 40 is considered to be the primary novel feature of the present invention in comparison to prior technology relating to capacitance membrane switches. As explained above, the conductive adhesive layer functions both electrically and mechanically in the capacitance switch 1, which is a significant departure from known capacitance membrane switch constructions. The conductive adhesive layer 40 comprises two principal ingredients: (1) conductive particles and (2) a resinous binder.

Conductive particles suitable for the conductive adhesive layer include silver, gold, copper, carbon and graphite particles. Silver particles provide excellent conductivity for the adhesive layer 40, but graphite particles are particularly useful since they provide very good conductivity at an economical cost. The conductive particles are to be distributed throughout the resinous binder of the conductive adhesive layer, for example they are distributed relatively uniformly within the binder as distinguished from being present as a stratified layer within the binder. The conductive particles are to be dispersed throughout the binder in "electrically touching" distribution, which term as used herein and in the claims is defined as meaning the conductive particles touch one another or are separated from one another by a small enough distance so that they provide an electrically conductive path through the conductive adhesive layer.

The binder for the conductive adhesive layer forms the resinous matrix within which the conductive particles are distributed and also acts as the material bonding together the two elements joined by the conductive adhesive layer, namely dielectric film layer 50 and layer 10 of the capacitance switch 1. The binder is to comprise a polymeric resinous material, with the particular binder selected for the conductive adhesive layer for a specific switch being dependent largely upon the composition of the layers 10 and 50. The binder is to conform to and bond to the layers 10 and 50 of the switch. The binder should bond intimately with the dielectric layer 50 so that there will be no or very little air entrapped between the adhesive-film interface which would alter the capacitance of each fixed capacitor of the switch. Thus, the binder should exhibit a high level of wet-out of the layer 50 and achieve consistent contact therewith so that the capacitance of the fixed capacitance switch areas will not fluctuate to a significant degree. Various resins can be used as the binder of the conductive adhesive layer including, for example, amine cured liquid epoxy resins, polyaziridine cured carboxy functional acrylic resins, heat activated polyester resins, silicone resins, urethane resins, malamine cured polyester resins, ultraviolet curable acrylate resins and the like. Silicone resins are the binder of choice when one or the other of the layers 10 and 50 comprises a polyolefin, polyvinyl fluoride or polyvinylidene fluoride film; the other named binders can be used with the other films previously disclosed as suitable for the layers 10 and 50 of the switch.

The conductive adhesive layer can be a heat activated adhesive, pressure sensitive adhesive, thermosetting adhesive, room temperature curable adhesive, or ultraviolet curable adhesive. Heat activated and thermosetting adhesives are considered especially useful since the addition of conductive particles appears to have less deleterious effect on the adhesion on these types of adhesives to the layers. The addition of conductive particles to pressure sensitive adhesives can make it more difficult to get sufficient flow of the adhesive to obtain good bonding at the adhesive-layer interfaces, but useful pressure sensitive adhesives can be formulated for the conductive adhesive layer. The conductive adhesive can be formulated as a solvent solution or hot melt composition, depending upon the type of equipment selected to apply the adhesive. A coatable solvent solution suitable for the conductive adhesive layer may include conductive particles, resinous binder, a curing agent as required for the binder, a solvent or solvents appropriate for the binder, and a defoaming agent. The solvent system should have an evaporation rate compatible with the application and drying equipment to be used.

The conductive adhesive layer 40 preferably is at least as thick as the nonconductive adhesive layer 30 which surrounds it, as described above. Thus, a conductive adhesive layer of about 0.1 to 5 mils thick is suitable for most membrane switch constructions, although the layer may be thicker if so desired. In general, it is preferable to apply the conductive adhesive layer at a slightly greater thickness than that of the nonconductive adhesive layer 30 in order to ensure intimate contact between the conductive adhesive and the two layers to which it is to bond, especially with the dielectric film layer 50. The conductive particles admixed with the resinous binder in the conductive adhesive layer should have a particle size that is less than the thickness of the conductive adhesive layer; if the conductive particles are larger than the thickness of the conductive adhesive layer, they could project slightly from the surfaces of the conductive adhesive layer and thereby impair the bonding of the surfaces to the dielectric film layer 50 and the layer 10 of the switch. In general, again depending upon the thickness of the conductive adhesive layer, conductive particles with a particle size in the range of less than 10 microns will be suitable Several representative formulae for the conductive adhesive layer are set forth below. All three formulae have been tested and proven to be useful in a capacitance membrane switch as described above, with Formula 1 being the preferred composition at the present time.

Formula 1 is based upon an isocyanate cured low molecular weight polyester binder, a viscous liquid of 90% solids content, and graphite for the conductive particles. The several ingredients are mixed together in a ball mill to prepare the composition. The conductive particles were about 50 microns in diameter prior to milling, and were estimated to be less than 10 microns in diameter after milling.

| Formula 1 | |
|---|---|
| Quantity | Ingredient |
| 100 grams | Polyester resin binder (Desmophen 670-90), 90% solids |
| 58 grams | Polyfunctional aliphatic isocyanate curing agent for binder (Desmodur N-751) |
| 80 grams | Flake graphite particles (Superior 8535) |
| 170 grams | Solvent blend of 80 gms high boiling aromatic solvent (Comsolve 100), 70 gms ethylene glycol ethyl ether acetate and 20 gms ethylene glycol butyl ether acetate |

-continued

| Formula 1 | |
|---|---|
| Quantity | Ingredient |
| 10 drops | Polysiloxane copolymer defoamer (Byk-320) |

Formula 2 employs an isocyanate cured acrylic resin as a binder and a mixture of graphite and carbon particles for the conductive particles. The composition was processed in the same manner as Formula 1, and the conductive particles size was estimated at less than 10 microns after ball milling.

| Formula 2 | |
|---|---|
| Quantity | Ingredient |
| 50.3 grams | Acrylic resin binder (Henkel G-Cure 868) |
| 9.8 grams | Curing agent for binder per Formula 1 |
| 17.0 grams | Graphite particles (Lonza KS-44) |
| 3.25 grams | Carbon black particles (Cabot XC-72R) |
| 30.0 grams | Solvent blend of 15 gms ethylene glycol ether acetate and 15 gms di-butyl ketone |
| 0.1 gram | Defoamer per Formula 1 |

Formula 3 is an example of a pressure sensitive adhesive suitable for the conductive adhesive layer which is based upon an acrylic binder and carbon particles as the conductive particles. The ingredients except for the acrylic resins were mixed by ball milling, following which the acrylic resins were added. The size of the conductive particles was estimated to be about 10 microns or less in the finished composition.

| Formula 3 | |
|---|---|
| Quantity | Ingredient |
| 31.0 grams | Solution acrylic resin binder (Gelva RA-1896) |
| 3.3 grams | Solution acrylic resin tackifier (Gelva RA-788) |
| 2.3 grams | Carbon particles (Black Pearls 2000) |
| 27.0 grams | Solvent blend of 17.5 gms ethylene glycol ethyl ether acetate and 9.5 gms di-butyl ketone |
| 0.1 gram | Defoamer per Formula 1 |

The conductive adhesive material can be applied to the layer 10 of the switch by any suitable manner. Screen printing has proved useful, particularly when the conductive adhesive layer is in the form of several spaced blocks such as described above in part (c). The specific application technique will depend, at least in part, upon the composition of the conductive adhesive and the configuration of the conductive adhesive layer.

The conductive adhesive layer 40, as described previously, is to function as one of the capacitor plates of the fixed capacitor of the switch 1 and also provide an electrical interface with a conductive pattern on the surface of the layer 10 to which it is bonded. The conductive adhesive layer should have a maximum sheet resistance of about 50 kiloohms/square, or lower. The sheet resistance of the conductive adhesive layer can be varied as required for a specific switch. Also, the sheet resistance of any specific conductive adhesive layer should be related to the frequency of any scanning circuit employed in combination with the capacitance switch. For systems operating at a relatively low frequency, such as about 100 Hertz as a sample frequency, the sheet resistivity of the conductive adhesive can be at the higher end of about 50 kiloohms/square; however, if the scanning circuit operates at a higher frequency, the sheet resistivity of the conductive adhesive layer should be regulated by the proportion of the conductive particles therein so as to have a lower sheet resistivity that this upper limit such as about 3 kiloohms/square or less. Also, the conductivity of the conductive adhesive layer can be augmented, if considered necessary when the switch is to be used with high frequency scanning circuits such as about 1 megaHertz, by increasing the area of the conductive pattern 12 under the conductive adhesive layer.

(2) Electrical Description

When the flexible film layer 60 and stratum 81 of the spacer layer 80 in FIG. 1 are joined by adhesive stratum 82 to the top of the sandwich of layers 10, 30 and 50, the capacitor plates 64 in FIG. 1 are in registry with the apertures 84 and 84' of spacer layer 80 and the capacitor plates 52 on layer 50. The assembled layers form an array of capacitive switches, one of these switches being seen in detail in FIG. 4.

FIG. 4 illustrates a capacitor plate 64 connected to conductor 71 that runs along the underside of the flexible film layer 60. The apertures 84 and 84' in the spacer layer 80 provide an air gap between the capacitor plate 64 and its underlying the capacitor plate 52, and forms, in effect, a variable capacitor (represented in phantom). This variable capacitor uses air as its dielectric, and is variable due to the ability of capacitor plate 64 to move downward and engage capacitor plate 52. When this occurs, the air gap is no longer present and the plate 64 and the plate 52 act as a conductor rather than as a capacitor.

The plate 52 and the block of conductive adhesive 47 form the upper and lower plates, respectively, of a fixed capacitor element (represented in phantom) that utilizes a portion of layer 50 as its dielectric. The conductive adhesive 47 contacts track 17 for transmission of a sense signal through the track 17 in response to a drive signal applied through conductor 71 to plate 64, air gap 84, plate 52, dielectric 50 and conductive adhesive 47. These elements are connected in series in a circuit path formed between the conductor 71 carrying the drive signal and conductors 16, 17 which carry the sense signals. If one of the capacitive switches is being operated by depressing layer 60, the variable capacitor is removed and only the fixed capacitor is effective in the switch circuit. This produces greater charge at the plates 52, 47 of the fixed capacitor and a flow of charge in tracks 16, 17 that produces the sense signals.

In forming the lower plate of a fixed capacitor, the conductive adhesive 47 is performing one of its three functions. It also functions as a bonding agent for layers 50 and 13 and as a contact interface that electrically connects an individual capacitive switch to one of the tracks 14–17, 14a–17a.

Also seen in FIG. 4 is a portion of neighboring capacitive switch that includes a capacitor plate 52 and a neighboring block of conductive adhesive 46 formed over conductive track 16. A sense signal for this neighboring switch is transmitted through the track 16. In between the two switches, a vent 91–91' formed by the spacer layer 80 is seen, as well as a portion of adhesive layer 30 that separates conductive adhesive blocks 46 and 47.

Referring now to FIG. 5, the decoding circuitry which is connected to the switch array 1 is controlled by a microcomputer 100, which in this embodiment is preferably a Model 8748 microcomputer with on-board memory available from Intel Corporation, Santa Clara, Calif. A clock circuit 101 that generates the base timing signals for the microcomputer 100 is connected to its XTAL1 and XTAL2 inputs. Details of the architecture, operation and instruction set for the microcomputer are available in commercial literature from the manufacturer, and particularly the MCS-48 Microcomputer Users Manual, published in 1976, and updated versions thereof. The microcomputer 100 has two 8-bit I/O ports, and four terminals (P20-P23) in one of these I/O ports are connected to transfer four drive signals to a 4-bit latch/1-of-16 decoder 102. Such a decoder is available under part designation CD4514B from RCA Corporation, Somerville, N.J. This circuit 102 receives, holds, and decodes four bits of information received from the microcomputer 100 and then enables one of the sixteen columns in the switch matrix 1 by generating an output signal, referred to herein as a drive signal. It will be noted with reference to FIG. 1 that only eight column conductors 70-77 have been shown. The specific embodiment shown there uses but eight of the possible sixteen columns that are available from the decoding circuitry, however, it is anticipated that other embodiments providing a 128-switch array would utilize all sixteen of the available drive signals.

The column lines in FIG. 7 correspond to the conductors 70-77 in FIG. 1, and form a grid with row lines in FIG. 7 that correspond to the conductive tracks 14-17 and 14a-17a in FIG. 1. As seen in FIG. 7, the row lines are connected to ground through a set of resistors 103, so that when current is present at the sense points 104 in FIG. 7, it will flow through the resistors 103 to provide voltages across the inputs of two 4-unit packages of comparators 105, 106. Quad packages of LM339 comparators available from National Semiconductor Corp., Santa Clara, Calif., are suitable for use as the comparators 105, 106. Each individual comparator converts an analog, capacitive signal generated from one of the capacitive switches to a logic level signal that can be read by the microcomputer 100. In this decoding circuit, the comparators 105, 106 are always active, so that a signal at any of the sense points 104 is available on one of the lines in the data bus 107 that couple the sense data to the microcomputer 100.

Referring back to FIG. 4, when a switch is deactuated, and a full air gap 84 is present, the application of a drive signal will result in a current of a low level and short duration that charges the air capacitor. This produces a voltage spike of short duration at the sense points 104 in FIG. 5. There is a delay of 25-30 microseconds between the generation of the drive signal and the sensing of the comparator outputs. This delay assures that the charging of the deactuated switches will not be seen by the microcomputer 100 as the actuation of the switches. The delay is accomplished by the selection and arrangement of the instructions executed by the microcomputer 100 to generate the drive signals, to wait for the delay period, and then to read the input data from the row lines.

On the other hand, assuming that the switch in FIG. 4 is actuated (depressed) when the drive signal is transmitted through plate 64, the increased capacitance will cause curent flow and will generate a voltage of approximately +5 DC volts at the input to one of the comparators 105, 106. Similar input voltages will also be generated for others of the comparators 105, 106 for each switch in the column that is actuated. The input voltages will appear on the row lines at the sense points 104, and will exceed the 175-millivolt threshhold voltage needed to switch the outputs of the comparators. The input voltage signal will then decay as the capacitive switch charges—at a rate determined by the RC time constant for each individual switch circuit. Near the end of this decay, the voltage across the comparator input will drop below the switching threshhold and the output of the comparator will switch back to its original state. The time period that the comparators are switched is long enough in this instance to allow the microcomputor 100 to read the changed state of the comparator outputs as representing the actuation of various switches in the matrix.

Each time a drive signal is transmitted on a column line such as conductor 71 in FIG. 4, the microcomputer 100 in FIG. 5 reads the status of eight switches in rows 1–8, respectively, which intersect that column in the switch matrix 1. Thus, both of the neighboring capacitive switches in FIG. 4 are sensed simultaneously along with six others that are not shown there.

After the microcomputer 100 executes instructions to drive the column lines and to read the row lines, it executes further instructions to discharge the array of capacitance switches. This produces a control signal from the microcomputer 100 that is transmitted to an inhibit (INH) input on the latch/decoder 102. This will ground the outputs of the latch/decoder 102, allowing the capacitive switches to discharge.

(3) Industrial Applicability

From the above description, it should now be apparent that the membrane switch 1 that has been described herein provides a capacitance switch array that will be useful in micro electronic equipment. The capacitance membrane switch 1 can be utilized in any industrial application in which a membrane switch is a desirable element. As compared to resistance type membrane switches, the present capacitance switches will generally exhibit a longer life that can be useful in various applications. They also have the capability of providing "n" key rollover when decoded in large matrix arrays. This means that the open or closed condition of any switch position in a matrix can be electronically detected regardless of the condition of all other switch positions. Typical installations for a capacitance membrane switch 1 are as a switch element of a full travel keyboard to provide a data entry keyboard that can be used with a computer, typewriter, calculator keyboard and the like. Also, the capacitance membrane switch 1 can be used as a control switch for appliances such as microwave ovens and stoves, or as a control panel for various types of instruments.

The switch 1 in the specific embodiments described above comprises a flexible film layer having a lower surface carrying a conductive pattern, a dielectric film layer having upper and lower surfaces, and a second layer having an upper surface carrying a conductive pattern, first spacer means between the lower surface of the flexible film layer and the upper surface of the dielectric film layer and second spacer means between the lower surface of the dielectric film layer and the upper surface of the second layer. The switch includes first capacitor plates on the lower surface of the flexible film layer, second capacitor plates on the upper surface of the dielectric film layer, and third capacitor plates between the lower surface of the dielectric film layer and the second layer, to thereby provide at least one switch array, preferably a plurality of switch arrays, each including first, second and third capacitor plates arranged so as to provide a variable capacitor between the first and second capacitor plates and a fixed capacitor between the second and third capacitor plates. The third capacitor plates are to consist of conductive adhesive bonded to the lower surface of the dielectric film layer and bonded to the upper surface of the second layer comprising conductive particles distributed within a polymeric binder matrix and developing an electrically conductive path through the binder matrix. The conductive adhesive operates electrically as a capacitor plate in the switch, operates mechanically to bond together portions of the dielectric film layer and the second layer, and operates electrically to form a conductive interface with the conductive pattern on the upper surface of the second layer.

The feature of a conductive adhesive layer to provide the foregoing characteristics has numerous advantages for the construction of a capacitance membrane switch. In this type of switch, it is desirable to generate high capacitance for the fixed capacitor element of the switch, which, in turn, requires the use of a thin dielectric film which may be only about 0.0001" to 0.0005" thick. It can be appreciated that printing capacitor plates on a film as thin as this would be very difficult and perhaps economically unfeasible. The use of a conductive adhesive layer as described above enables a manufacturer to apply the conductive adhesive layer in the required pattern on an upper surface of the second layer, such as the layer 10 described above, laminate the very thin dielectric film layer to the second layer by means of, in part, the conductive adhesive layer, and thereafter print second capacitor plates on the exposed first surface of the dielectric film layer. This makes it relatively easy from a manufacturing standpoint to print the second capacitor plates on the dielectric film layer and eliminates the need to print third capacitor plates on its lower surface inasmuch as the conductive adhesive provides this element of the switch construction. Secondly, use of conductive adhesive for the third capacitor plates gives the manufacturer a great deal of flexibility with respect to the location and configuration of the third capacitor plates in comparison, for example, to vapor deposition metalization techniques employed in certain prior art for forming capacitor plates. Also, there is a reduction of both the number and the complexity of the manufacturing operations that have to be performed on a very thin film such as the dielectric film layer. As noted, the need to print capacitor plates on a thin unsupported dielectric film layer has been eliminated, and there is also a reduction in steps such as slitting thin film into narrow strips as in some prior constructions. Fourthly, bearing in mind that the thin dielectric film layer will be quite fragile, the conductive adhesive construction of the present invention provides for enhanced support of the dielectric film layer in a mechanical sense due to its adhesion thereto and also in an electrical sense since electrical contact can be distributed over a substantially large area. Lastly, it has been found during the development of the present invention that the use of a conductive adhesive layer in the manner disclosed provides significant flexibility in keyboard design or layout since connection with the dielectric layer can take place anywhere along the layer, thereby reducing spatial limitations in capacitance switch designs.

The present invention has been described hereinabove by reference to various specific embodiments, but it is anticipated those of ordinary skill in the art of manufacturing membrane switches will be able to devise modifications and variations thereof that will remain within the spirit and scope of the present invention and it is intended to encompass such obvious modifications within the appended claims.

I claim:

1. In a capacitance membrane switch of the type including (1) a fixed capacitor defined by a dielectric film layer having an upper surface and a lower surface, a capacitor plate on the upper surface of the dielectric film layer and a capacitor plate on the lower surface of the dielectric film layer, and (2) a second layer spaced from the dielectric film layer and having an upper surface facing the lower surface of the dielectric film layer, with a conductive pattern on the upper surface of the second layer, the improvement wherein: the capacitor plate on the lower surface of the dielectric film layer consists of conductive adhesive bonded to the dielectric film layer on the lower surface thereof opposite from the capacitor plate on the upper surface of the dielectric film layer to thereby form a fixed capacitor, the conductive adhesive also being bonded to the upper surface of the second layer to form an electrical interface with the conductive pattern thereon.

2. In a capacitance membrane switch of the type including (1) a first layer comprising a flexible film layer having a conductive pattern on a lower surface including a first capacitor plate, (2) a dielectric film layer spaced from the first layer and having an upper surface and a lower surface, the upper surface facing the lower surface of the first layer and having a second capacitor plate under the first capacitor plate and spaced therefrom by an air gap to form a variable capacitor, (3) a second layer spaced from the dielectric film layer and having an upper surface facing the lower surface of the dielectric film layer, with a conductive pattern on the upper surface of the second layer, the improvement comprising: a third capacitor plate under the first and second capacitor plates and consisting of conductive adhesive bonded to the lower surface of the dielectric film layer and bonded to the upper surface of the second layer, the second capacitor plate, conductive adhesive and dielectric film therebetween forming a fixed capacitor in series with the variable capacitor, and the conductive adhesive forming an electrical interface with the conductive pattern on the upper surface of the second layer.

3. In a capacitance membrane switch of the type including (1) a first layer comprising a flexible film layer having a conductive pattern on a lower surface thereof including a plurality of first capacitor plates, (2) a dielectric film layer spaced from the first layer and having an upper surface and a lower surface, the upper surface facing the lower surface of the first layer and including a plurality of second capacitor plates, there being a second capacitor plate under each first capacitor plate and spaced therefrom by an air gap to form a variable capacitor, therewith, (3) a second layer spaced from the dielectric film layer and having an upper surface facing the lower surface of the dielectric layer, with a conductive pattern on the upper surface of the second layer, the improvement comprising: a plurality of third capacitor plates, there being a third capacitor plate under each first and second capacitor plate, each third capacitor plate consisting of conductive adhesive bonded to the lower surface of the dielectric film layer and bonded to the upper surface of the second layer, each second capacitor plate, third capacitor plate of conductive adhesive and dielectric film layer therebetween defining a fixed capacitor in series with each variable capacitor, and the conductive adhesive forming an electrical interface with the conductive pattern on the upper surface of the second layer.

4. A capacitance membrane switch according to claim 1, 2 or 3 wherein: the conductive adhesive comprises a polymeric resinous binder matrix and conductive particles distributed throughout the matrix in electrically touching dispersement, the binder being bonded to each layer to which the conductive adhesive is bonded.

* * * * *